United States Patent
Li et al.

(10) Patent No.: US 7,361,587 B1
(45) Date of Patent: Apr. 22, 2008

(54) SEMICONDUCTOR CONTACT AND NITRIDE SPACER FORMATION SYSTEM AND METHOD

(75) Inventors: Wenmei Li, Sunnyvale, CA (US);
Angela T. Hui, Fremont, CA (US);
Dawn Hopper, San Jose, CA (US);
Kouros Ghandehari, Fremont, CA (US)

(73) Assignee: Spansion, LLC, Sunnyvale, CA (US)

( * ) Notice: Subject to any disclaimer, the term of this patent is extended or adjusted under 35 U.S.C. 154(b) by 263 days.

(21) Appl. No.: 10/934,923

(22) Filed: Sep. 2, 2004

(51) Int. Cl.
*H01L 21/4763* (2006.01)
(52) U.S. Cl. .............. 438/634; 438/970; 257/E21.626
(58) Field of Classification Search .............. 438/233, 438/533, 634, 970
See application file for complete search history.

(56) References Cited

U.S. PATENT DOCUMENTS 6,078,073 A * 6/2000 Habu et al. ................. 257/296
6,441,418 B1 * 8/2002 Shields et al. .............. 257/296

* cited by examiner

*Primary Examiner*—Chandra Chaudhari

(57) ABSTRACT

The present invention is a semiconductor contact formation system and methods that form contact insulation regions comprising multiple etch stop sublayers that facilitate formation of contacts. This contract formation process provides relatively small substrate connections while addressing critical lithographic printing limitation concerns in forming contact holes with small dimensions. In one embodiment, a multiple etch stop contact formation process in which a multiple etch stop insulation layer comprising multiple etch stop layers is deposited. A contact region is formed in the multiple etch stop insulation layer by selectively removing (e.g., etching) some of the multiple etch stop insulation layer. In one embodiment a larger portion of the multiple etch stop insulation layer is removed close to the metal layer and a smaller portion is removed closer to the substrate. The different contact region width are achieved by performing multiple etching processes controlled by the multiple etch stop layers in the multiple etch stop insulation layer and spacer formation to shrink contact size at a bottom portion. Electrical conducting material (e.g., tungsten) is deposited in the contact region.

16 Claims, 11 Drawing Sheets

200

```
Depositing a multiple etch stop insulation layer.
210
          │
          ▼
Creating a contact region in the multiple etch stop layer.
220
          │
          ▼
Depositing a conducting material in the contact region.
230
```

```
Etching away a portion of a second sub interlevel layer.
221
          │
          ▼
Removing a portion of a second etch stop layer.
222
          │
          ▼
Depositing spacer dielectric material and etching to form a
sub spacer region.
223
          │
          ▼
Etching away a portion of a first sub interlevel layer.
224
          │
          ▼
Removing a portion of a first etch stop layer.
226
          │
          ▼
Depositing a conductive material.
227
```

FIG. 2C

SEMICONDUCTOR CONTACT AND NITRIDE SPACER FORMATION SYSTEM AND METHOD

TECHNICAL FIELD

The present claimed invention relates to the field of semiconductor contact fabrication. More particularly, the present invention relates to a semiconductor contact fabrication system and method that utilizes multiple etch stop layers.

BACKGROUND ART

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include integrated circuits. Integrated circuits typically include contact regions for conducting electricity (e.g., between active components). Contact fabrication usually involves processes that attempt to produce precise components that operate properly and is often very difficult to achieve optimized results within requisite narrow tolerances.

Semiconductor integrated circuit manufacturing efforts are usually complicated by ever increasing demands for greater functionality. More complicated circuits are usually required to satisfy the demand for greater functionality. For example, there is usually a proportional relationship between the number of components included in an integrated circuit and the functionality, integrated circuits with more components typically provide greater functionality. However, including more components within an integrated circuit often requires the components to be densely packed in relatively small areas and reliably packing a lot of components in relatively small areas of an IC is usually very difficult.

One traditional focus for achieving greater densities has been directed towards reducing the size of individual components (e.g., transistors). The components of an integrated circuit are usually fabricated on a single silicon substrate and maintaining both the integrity of the system as a whole as well as the individual basic device characteristics is very important for proper operation. Proper relational characteristics are very helpful in achieving these objectives and without them there is a tendency for detrimental interactions to occur. Thus, it is important for integrated circuit fabrication technologies to provide an advantageous balance between component integrity and increased component density.

Semiconductor contact formation processes usually include the creation of a contact void for deposition of the contact layer. The contact void creation determines the contact configuration. The smaller the void the more compact the contact and the greater the possible component density. However, decreases in contact sizes are usually limited by contact void creation processes (such as lithographic etching processes). Standard lithographic etching and removal processes traditionally have difficulty producing relatively small contact voids. Complex process for creating smaller voids are often cost prohibitive or nonfeasible.

While decreasing the size of a contact usually permits greater component densities there are usually physical limitations on how small the contact can become and still operate properly. It is important for contacts to be formed in a manner that ensures proper operation without defects. Interconnection phenomenon such as electromigration can cause reliability problems as the dimension of the contact becomes very small. For example, electromigration can cause discontinuities in conducting materials if the dimensions are too small. Thus, most conducting materials have a critical dimension (CD) that limits how small a contact can be and still operate reliably. Fabrication of small contacts with desirable CD characteristics can be challenging.

It is also important to maintain adequate insulation around the contacts. Without proper component insulation there is a tendency for detrimental interactions between component parts to occur that hinder proper and reliable operation. For example, placement of more component in smaller spaces by reducing the separation between adjacent component parts often increases the probabilities of failures associated with leakage currents. It is also desirable for the integrated circuit component formation processes to be efficient and low cost. While introduction of complex and complicated lithographic techniques may attempt to provide small size components, these advance techniques usually consume significant resources and are very expensive. Standard lithographic techniques are usually more efficient and do not require extensive retooling efforts. Therefore, the ability to precisely form semiconductor contact regions in a convenient and efficient manner is often very important.

SUMMARY OF THE INVENTION

The present invention is a semiconductor contact formation system and method. In one embodiment a contact formation process forms contact insulation regions comprising multiple etch stop sublayers that facilitate formation of contacts. This contact formation process provides relatively small substrate connections while addressing critical dimension concerns in coupling to metal layers. The integrated circuit formation process also facilitates the creation of compact high density components (e.g., flash memory cells) that operate reliably. In one embodiment a multiple etch stop contact formation process in which a multiple etch stop insulation layer comprising multiple etch stop layers is deposited. A contact region is formed in the multiple etch stop insulation layer by selectively removing (e.g., etching) some of the multiple etch stop insulation layer. In one embodiment a larger portion of the multiple etch stop insulation layer is removed close to the metal layer and a smaller portion is removed closer to the substrate. In one exemplary implementation the different contact region width are achieved by performing multiple etching processes controlled by the multiple etch stop layers in the multiple etch stop insulation layer. Electrical conducting material (e.g., tungsten) is deposited in the contact region.

BRIEF DESCRIPTION OF THE DRAWINGS

FIG. 2A is a flow chart of a contact formation process in accordance with one embodiment of the present invention.

FIG. 2C is a flow chart of a multiple etch stop contact formation process in accordance with one embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

A present invention contact system and method includes contact insulation regions comprising multiple etch stop sublayers. In one embodiment of the present invention, the contact regions can be characterized by a relatively small substrate contact area and relatively large metal layer connection area. The relatively small substrate contact area permits multiple active regions of an integrated circuit to be arranged relatively close to one another to achieve higher density.

Figure 1A:
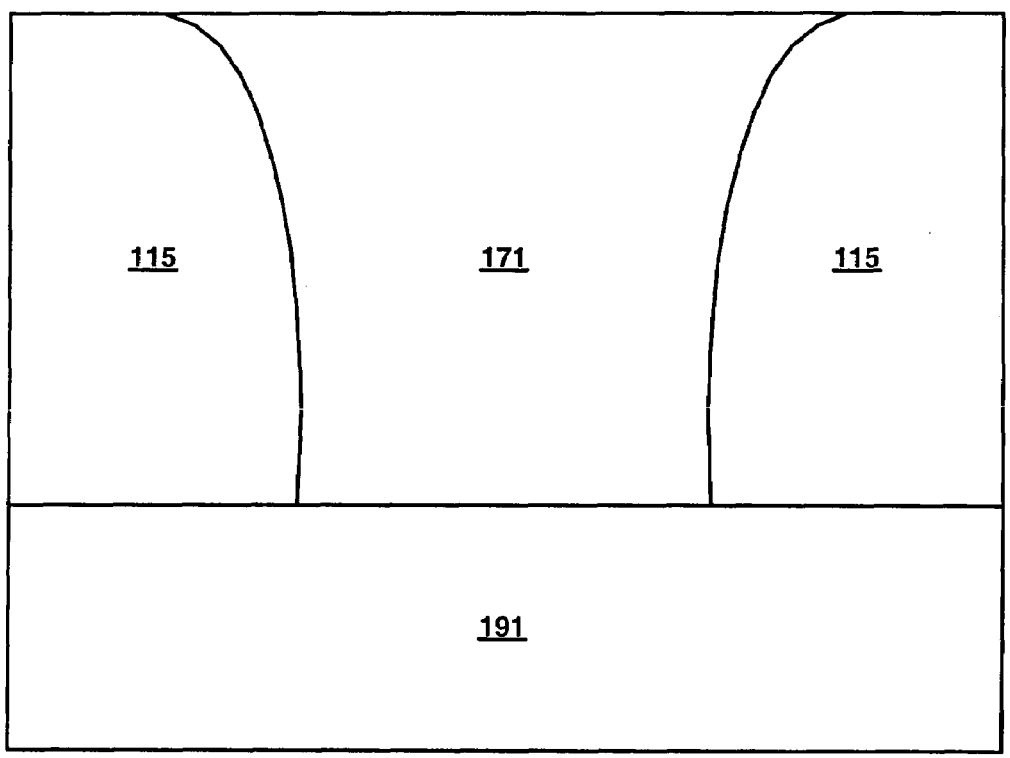
FIG. 1A is a block diagram of an integrated circuit with a substrate contact in accordance with one embodiment of the present invention.

FIG. 1A is a block diagram of integrated circuit 100A, an integrated circuit with a substrate contact in accordance with one embodiment of the present invention. Integrated circuit comprises substrate 191, a multiple etch stop insulation layer 115, and a contact region 171. In one exemplary implementation of the present invention multiple etch stop insulation layer 115 is an interlevel dielectric layer. Substrate 191 provides an electrical well for integrated circuit 100. Contact region 171 is coupled to substrate 191 and provides an electrical path to and from substrate 191. Multiple etch stop insulation layer 115 is coupled to contact region 171 and comprises a plurality of sublayers including multiple etch stop layers. Multiple etch stop insulation layer provides electrical insulation between other regions of integrated circuit 100 (e.g., not shown) and isolates guidance of electrical current flow in contact region 171.

Figure 1B:
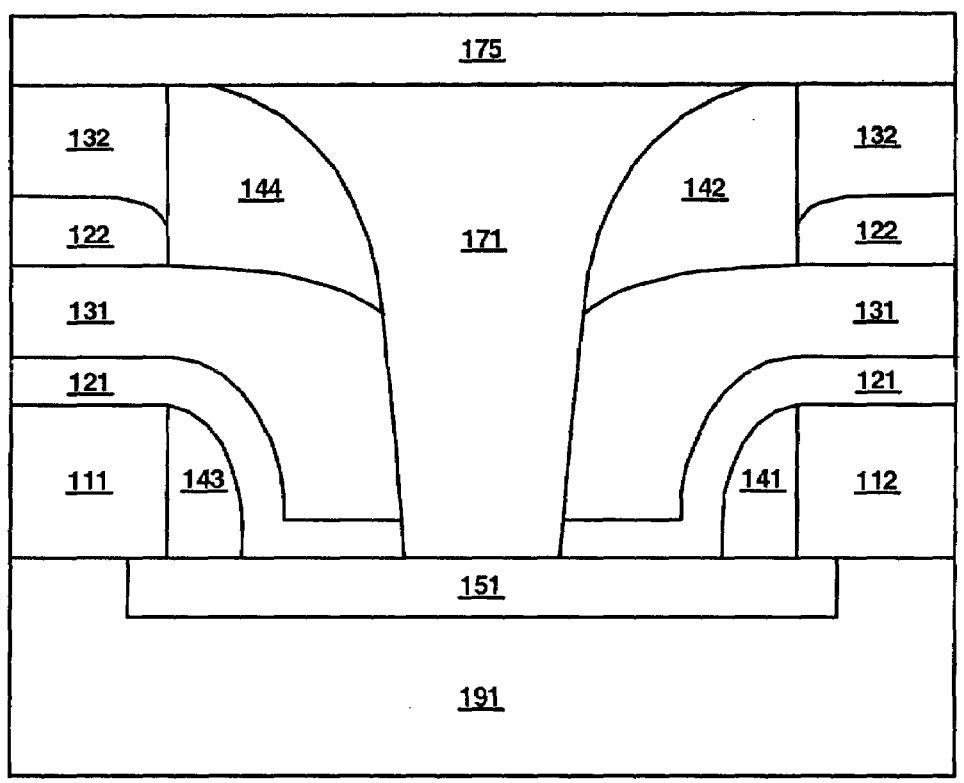
FIG. 1B is a block diagram showing a multiple etch stop insulation layer in accordance with one embodiment of the present invention.

FIG. 1B is a block diagram of integrated circuit 100B, one embodiment of integrated circuit 100A in accordance with the present invention. In integrated circuit 100B multiple etch stop insulation layer 115 comprises etch stop layer 121, sub interlevel dielectric layer 131, etch stop layer 122, sub interlevel dielectric layer 132 and spacer regions 141 through 144 (e.g., nitride). In one exemplary implementation, integrated circuit 100B includes a gate region 111 and gate region 112 and a source or drain region (e.g., 151). Gate region 111 is coupled to substrate 191, spacer region 143 (e.g., nitride) and etch stop layer 121 which is coupled to sub interlevel dielectric layer 131. Sub interlevel dielectric layer 131 is coupled to spacer region 144 (e.g., nitride) and etch stop layer 122 which in turn is coupled to sub interlevel dielectric layer 132. Contact region 171 is coupled to substrate 191, sub interlevel dielectric layer 131 and spacer region 144 (e.g., nitride).

The components of device 100B cooperatively operate to provide an active device. Gate regions 111 and 112 control the flow of electricity between source and drain regions (e.g., region 151 and another similar region not shown). Contact region 171 conducts electrical current flow to and/or from regions of substrate 191. For example, contact region 171 can conduct electrical current flow to and/or from a source or drain region (e.g., 151). Sub interlevel dielectric layer 131, sub interlevel dielectric layer 132 and spacer regions 141 through 144 provide electrical insulation between contact region 171 other regions of device 100 (e.g., gates 111 and 112) and isolate guidance of electrical current flow in contact region 171. Etch stop layer 121 and etch stop layer 122 facilitate definition of the configuration of contact region 171.

In one embodiment of device 100B, contact region 171 has a relatively small substrate contact area and relatively large metal layer connection area (e.g., coupled to metal layer 175). For example, the substrate contact width can be controlled by spacer width 142 and 143 to the range of 0.09 µm to 0.13 µm and the metal connection area width can be 0.16 µm to 0.3 µm. The relatively small substrate contact area permits multiple active regions (e.g., gate regions 111 and 112) to be arranged relatively close to one another while the relatively large metal layer connection areas of device facilitate avoidance of critical dimension (CD) issues.

FIG. 2A is a flow chart of contact formation process 200, one embodiment of the present invention. Contact formation process 200 facilitates the fabrication of contact regions with a relatively small substrate contact area and relatively large metal layer connection area. The relatively small substrate contact area permits multiple active regions in an integrated circuit to be arranged relatively close to one another while the relatively large metal layer connection area facilitate avoidance of CD issues.

At step 210 a multiple etch stop insulation layer comprising multiple etch stop layers is deposited. In one embodiment of the present invention the multiple etch stop insulation layer is an interlevel dielectric layer. The multiple etch stop insulation layer permits etch flexibility with the combination of spacer formation 142 and 144 to create small contact formation. In one exemplary implementation the multiple etch stop insulation layer is made smooth and level (e.g., polished by a CMP process). In one embodiment of the present invention, step 210 includes a multiple etch stop insulation layer deposition process.

Figure 2B:
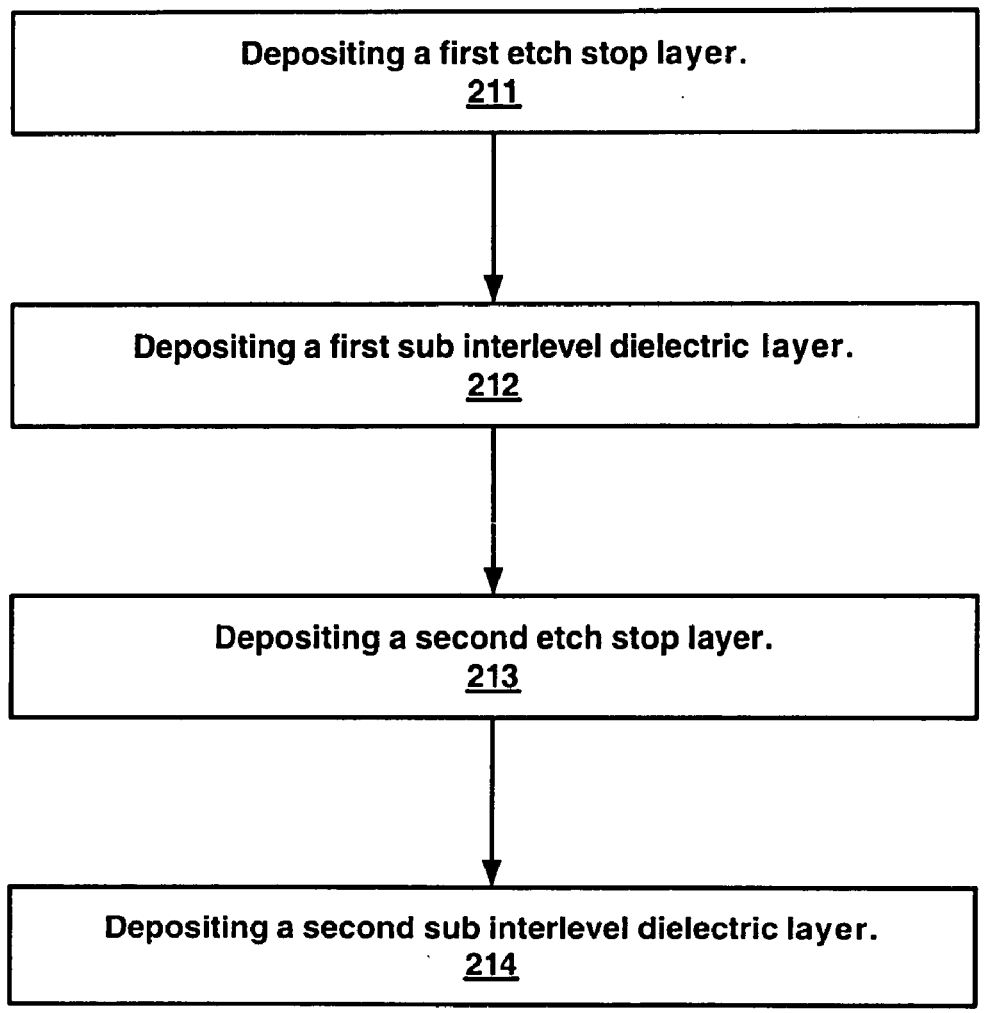
FIG. 2B is a flow chart of one embodiment of present invention multiple etch stop insulation layer deposition process.
Figure 3A:
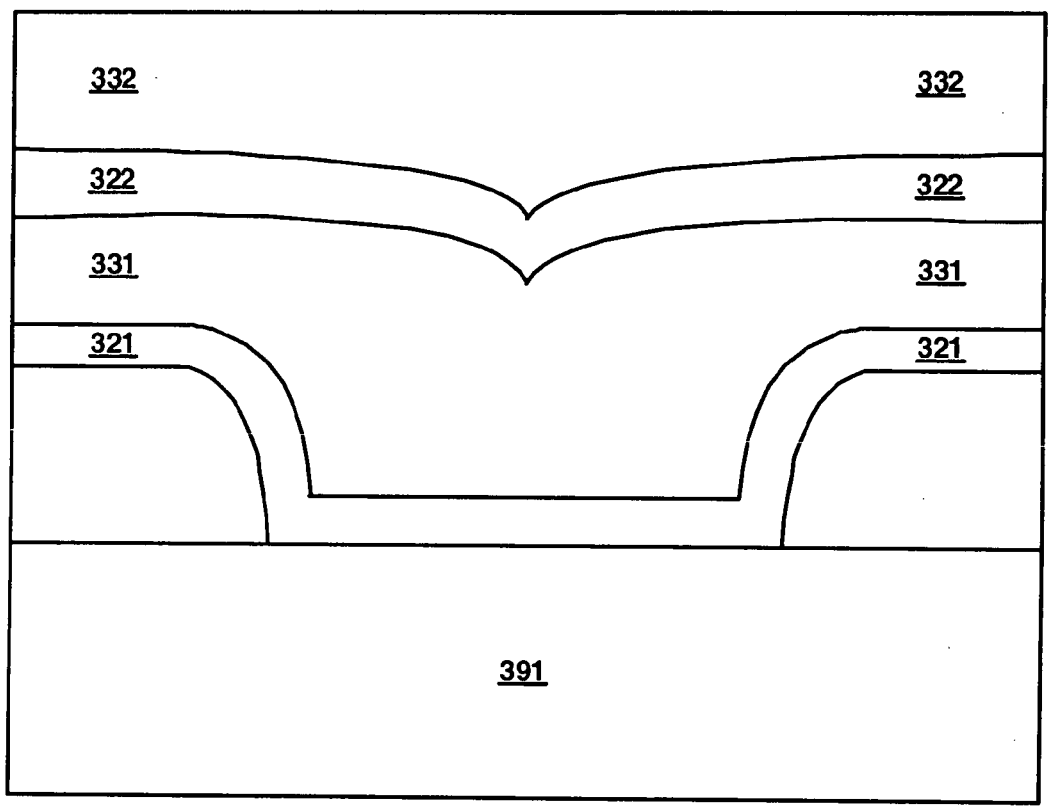
FIG. 3A is an illustration of one embodiment of a wafer after performing a multiple etch stop insulation layer deposition process.

FIG. 2B is a flow chart of one embodiment of multiple etch stop insulation layer deposition process 210 and FIG. 3A is an illustration of one embodiment of a wafer after performing multiple etch stop insulation layer deposition process 210. In step 211 etch stop layer 321 is deposited (e.g., 200-500 Å thick). At step 212 sub interlevel dielectric layer 331 is deposited (1,000 to 2000 Å). Etch stop layer 322 (e.g., 200-500 Å thick) is deposited at step 213. In step 214, another sub interlevel dielectric layer 332 is deposited (e.g., 10 KÅ±1 KÅ). In one exemplary implementation the etch stop layers are nitride or SiON and the sub interlevel dielectric layers are oxide. In one embodiments an ARC layer is deposited (e.g., an ARC film with $Si_3N_4$, SiON, or $Si_3N_4$/OX).

Referring to FIG. 2A again, a contact region is created in the multiple etch stop insulation layer at step 220. In one embodiment of the present invention, a multiple step etch process creates a contact region in the multiple etch stop insulation layer. In one exemplary implementation, the multiple etch stop insulation layers creates etching processes with non-lithographic spacer formation using multiple steps so that smaller contact holes (e.g., 0.06 µm to 0.13 µm) can be created close to the substrate and larger contact top (e.g., 0.16 µm to 0.18 µm) can be created closer to a metal layer connection. In one embodiment the contact region is created by a multiple etch stop contact formation process.

Figure 3B:
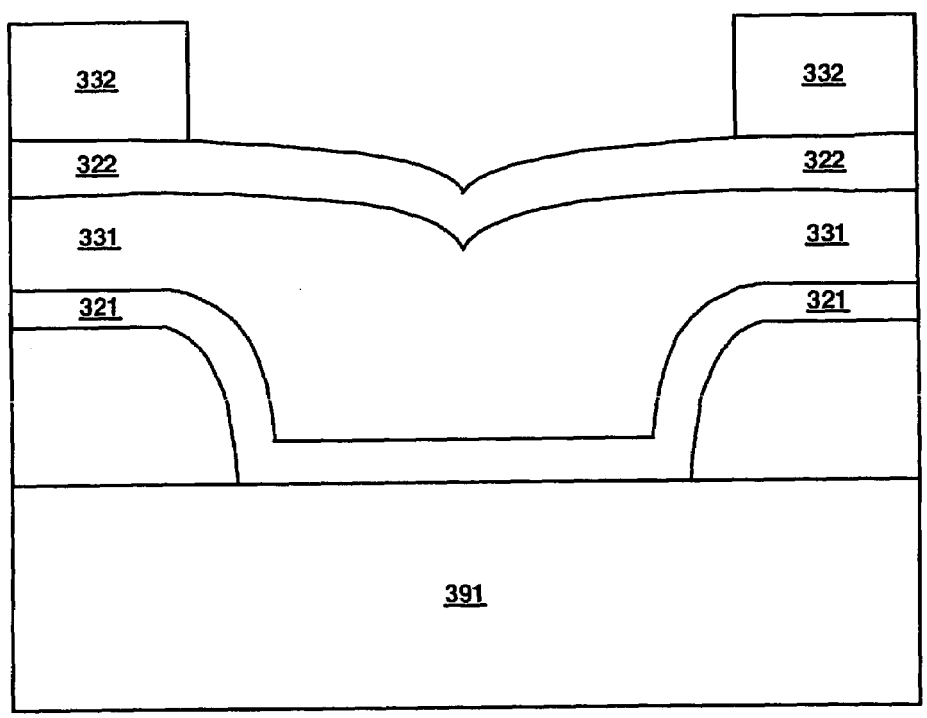
FIG. 3B is an illustration of one embodiment of a wafer after a portion of a sub interlevel dielectric layer is etched away in accordance with one embodiment of the present invention.
Figure 3C:
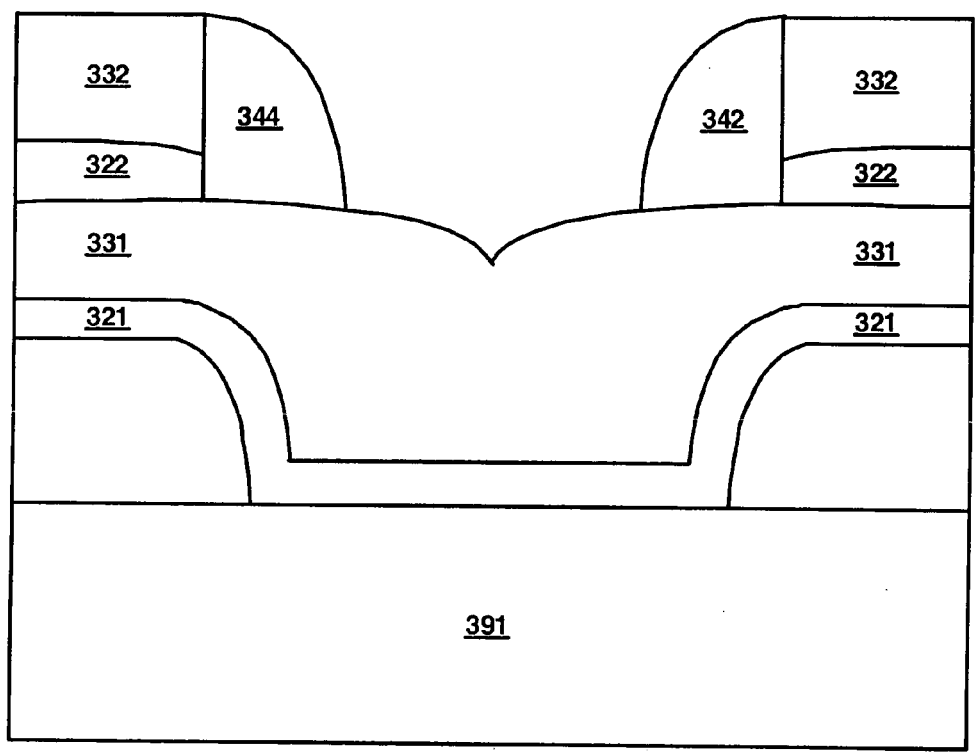
FIG. 3C is an illustration of one embodiment of a wafer after a portion of etch stop layer is removed and a spacer is formed in accordance with the present invention.
Figure 3D:
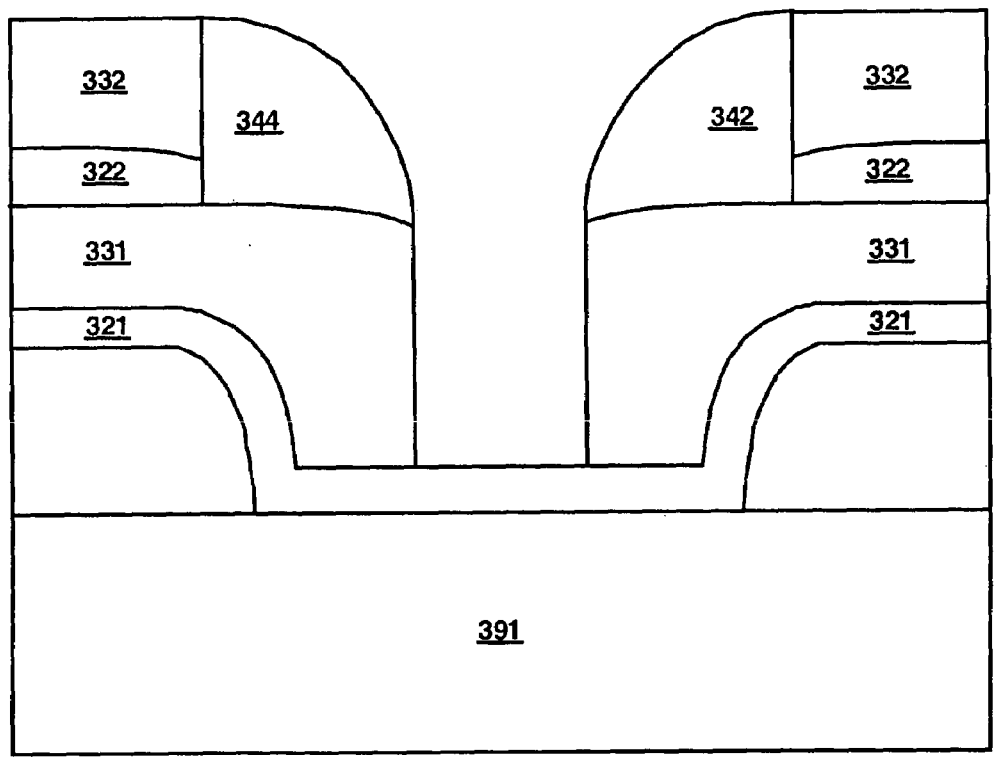
FIG. 3D is an illustration of one embodiment of a wafer after a portion of sub interlevel dielectric layer is etched away.
Figure 3E:
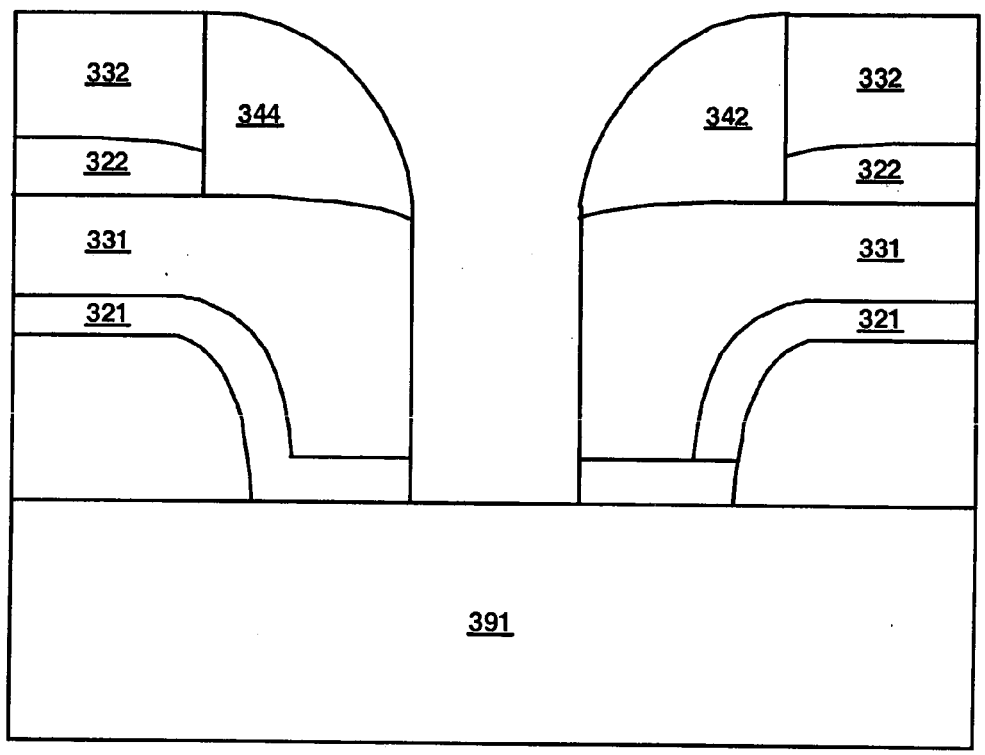
FIG. 3E is an illustration of one embodiment of a wafer after a substrate protective etch stop layer is removed.

FIG. 2C is a flow chart of multiple etch stop contact formation process 220A in accordance with one embodiment of the present invention. In step 221a portion (e.g., 0.16 µm to 0.18 µm width region) of sub interlevel dielectric layer 332 is etched away. FIG. 3B is an illustration of one embodiment of a wafer after a portion of sub interlevel dielectric layer 332 is etched away in step 221. A portion (e.g., 0.16 µm to 0.18 µm width region) of etch stop layer 322 is removed in step 222. In step 223 sub spacer regions 342 and 344 are formed. In one exemplary implementation the spacers are formed by depositing nitride. FIG. 3C is an illustration of one embodiment of a wafer after a portion of etch stop layer 322 is removed in step 222 and sub spacer regions 342 and 344 are formed in step 223. In step 224 a portion (e.g., 0.06 µm to 0.13 µm width region) of sub interlevel dielectric layer 331 is etched. FIG. 3D is an illustration of one embodiment of a wafer after a portion of sub interlevel dielectric layer 331 is etched away in step 224. In one exemplary implementation spacer region 143 is nitride. A portion (e.g., 0.06 µm to 0.13 µm width region) of etch stop layer 321 is removed in step 226. FIG. 3E is an illustration of one embodiment of a wafer after step 226 is performed. In step 227 a conductive material is deposited in the void left after said etching and removing of the portions of the first sub interlevel dielectric layer, the first etch stop layer, the second sub interlevel dielectric layer, and the second etch stop layer.

Referring now to step 230 shown in FIG. 2A, a conducting material (e.g., tungsten) is deposited in the contact region. For example a metal layer is deposited. In one embodiment of the present invention, a plurality of metal layers are deposited and each of the respective metal layers are separated by insulating layers. The metal layers can selectively couple integrated circuit components formed on the wafer to each other and external components.

Figure 4:
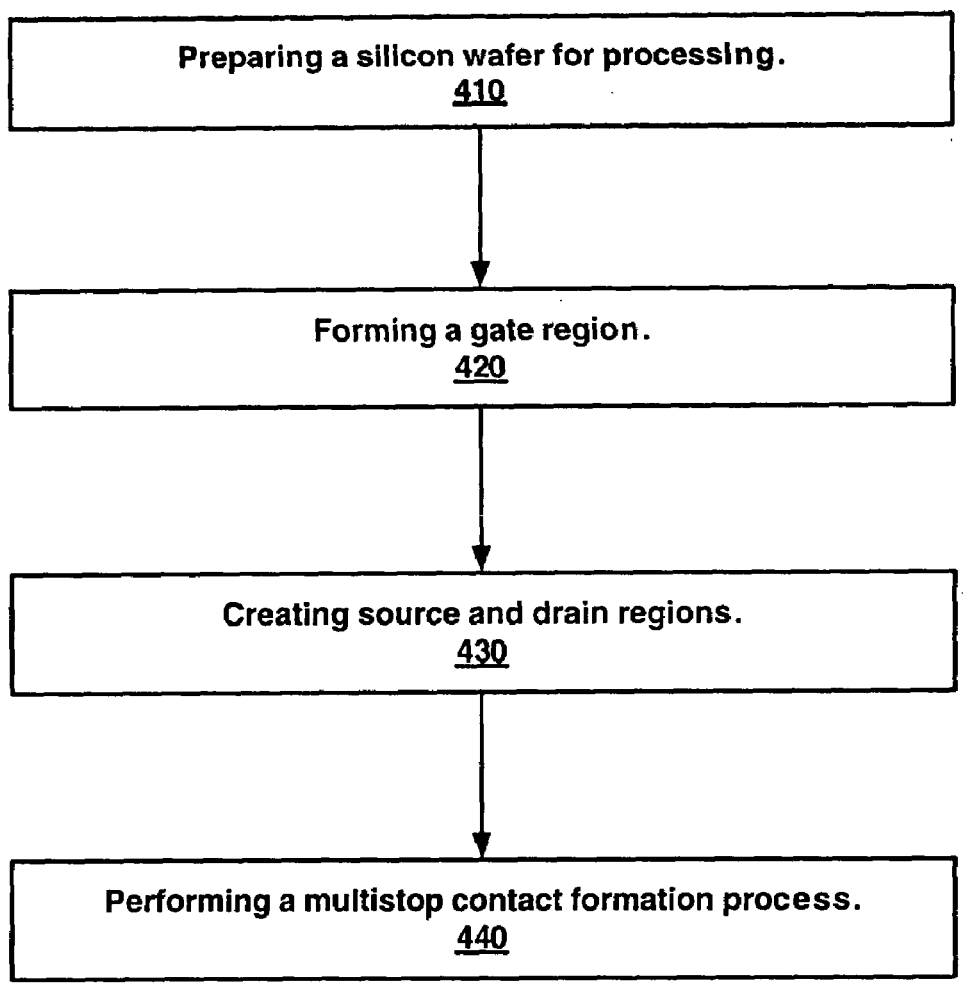
FIG. 4 is a flow chart of an integrated circuit method including a contact formation process in accordance with one embodiment of the present invention.

In one embodiment, a present invention contact formation process is included in an integrated circuit fabrication process. In one exemplary implementation, a present invention contact formation process is utilized to provide electrical contacts to a source and drain region. For example, contacts are formed to couple a flash memory cell source and drain region to word and bit lines. FIG. 4 is a flow chart of integrated circuit formation process 400, including a contact formation process in accordance with one embodiment of the present invention.

In step 410 a silicon wafer substrate is prepared for processing. In one embodiment of the present invention, the wafer surface is made smooth and level, for example by chemical mechanical polishing (CMP). An oxide pad layer and a subsequent protective layer of nitride are deposited on the surface. In one exemplary implementation, additional polishing is performed to provide a smooth and level surface after the protective oxide and nitride layers are added.

In step 420 a gate region is formed. In one embodiment of the present invention, forming a gate region comprises depositing a gate insulation layer, depositing a control gate layer, and removing the gate insulation layer and the control gate layer from non gate region areas. In one embodiment of the present invention, a floating gate is formed in step 420. An insulating layer (e.g., oxide) is deposited and a floating gate area is created in the insulating layer. For example, a floating gate area is etched in the insulating layer and a charge trapping material (e.g., a polysilicide) is deposited in the floating gate area. Excess charge trapping material is removed and additional insulating material deposited. A control gate material (e.g., polysilicon) is deposited on top of the insulating material. The materials deposited during the gate formation process are removed (e.g., etched) from areas not included in the gate (e.g., areas above a source and drain). In one exemplary implementation, a sidewall spacer material (e.g., nitride) is deposited on the sides of the gate area and excess sidewall spacer material is removed.

Source and drain regions are created in step 430. In one embodiment of the present invention a source and drain formation process is performed. The source and drain area are prepared for implantation and diffusion. For example, excess material from the gate formation process and the protective layer materials over the source and drain areas are removed. In one exemplary implementation dopants (e.g., arsenic, phosphorus, boron, etc.) are then introduced into the substrate in the source and drain regions by implantation and/or diffusion.

In step 440, a multiple etch stop contact formation process (e.g., contact formation process 200) is performed. A multiple etch stop insulation layer comprising multiple etch stop layers is deposited. A contact region is formed in the multiple etch stop insulation layer by selectively removing (e.g., etching) some of the multiple etch stop insulation layer. Electrical conducting material (e.g., tungsten) is deposited in the contact region.

Thus, the present invention facilitates precise formation of semiconductor contact regions in a convenient and efficient manner. Utilization of a multi etch stop process in formation of the semiconductor contact regions enables simple lithographic processes to provide contact with relatively small substrate patterns and relatively large metal layer connection patterns. This contact formation process provides contacts with small CD features. The shallow junctions also enable reductions in space between integrated circuit components permitting realization of increased component density (e.g., a larger number of components concentrated in smaller areas).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A contact formation process comprising;
   preparing a silicon wafer substrate;
   forming a gate region;
   creating source and drain regions;
   depositing a multiple etch stop insulation layer comprising multiple etch stop layers;
   forming a contact region in said multiple etch stop insulation layer by selectively removing some of said multiple etch stop insulation layer and forming at least one sub spacer such that a substrate coupling area of said contact region is smaller than a metal layer coupling area of said contact region; and
   depositing an electrical conducting material in said contact region.

2. A contact formation process of claim 1 wherein the at least one sub spacer comprises nitride.

3. A contact formation process of claim 2 wherein said depositing said multiple etch stop insulation layer comprises:
   depositing a first etch stop layer;
   depositing a first sub interlevel dielectric layer;
   depositing a second etch stop layer, and
   depositing a second sub interlevel dielectric layer.

4. A contact formation process of claim 3 further comprising depositing an ARC (anti-reflective coating) layer.

5. A contact formation process of claim 3, wherein said selectively removing some of said multiple etch stop insulation layer further comprises:
   etching away a portion of said second sub interlevel dielectric layer;
   removing a portion of said second etch stop layer;
   depositing a spacer dielectric material and etching to form said at least one sub spacer;
   etching away a portion of said first sub interlevel dielectric layer; and
   removing a portion of said first etch stop layer.

6. A contact formation process of claim 2 wherein said substrate coupling area of said contact region ranges between 0.06 micro-meter and 0.13 micro-meter; and wherein said metal layer coupling area of said contact region ranges between 0.16 micro-meter and 0.18 micro-meter.

7. A contact formation process of claim 1 wherein said preparing silicon comprises:
   planarizing said silicon wafer substrate;
   depositing an oxide pad layer;
   depositing a nitride protective layer; and
   polishing said nitride protective layer.

8. A contact formation process of claim 1 wherein said forming said gate region comprises:
   depositing a gate insulation layer;
   depositing a control gate layer; and
   removing said gate insulation layer and said control gate layer from non gate region areas.

9. A contact formation process of claim 8 further comprising forming a floating gate.

10. A contact formation process of claim 1 wherein said creating source and drain regions comprises introducing dopants into said silicon wafer substrate.

11. A contact formation process comprising:
    depositing a multiple etch stop insulation layer comprising multiple etch stop layers;
    forming a contact region in said multiple etch stop insulation layer by selectively removing some of said multiple etch stop insulation layer and forming at least one sub spacer such that a substrate coupling area of said contact region is smaller than a metal layer coupling area of said contact region; and
    depositing a conducting material in said contact region.

12. A contact formation process of claim 11 wherein said depositing said multiple etch stop insulation layer comprises:
    depositing a first etch stop layer;
    depositing a first sub interlevel dielectric layer;
    depositing a second etch stop layer, and
    depositing a second sub interlevel dielectric layer.

13. A contact formation process of claim 12 wherein said selectively removing some of said multiple etch stop insulation layer further comprises:
    etching away a portion of said second sub interlevel dielectric layer;
    removing a portion of said second etch stop layer;
    depositing a spacer dielectric material and etching to form said at least one sub spacer;
    etching away a portion of said first sub interlevel dielectric layer; and
    removing a portion of said first etch stop layer.

14. A contact formation process of claim 13 wherein said first etch stop layer and second etch stop layer comprise nitride.

15. A contact formation process of claim 13 wherein said at least one sub spacer comprises nitride and SiON.

16. A contact formation process of claim 11 wherein said forming said contact region is performed by a lithography process combined with a non-lithography spacer formation process to achieve a sub-100 micro-meter contact bottom dimension.

* * * * *

UNITED STATES PATENT AND TRADEMARK OFFICE
CERTIFICATE OF CORRECTION

| | | |
|---|---|---|
| PATENT NO. | : 7,361,587 B1 | Page 1 of 1 |
| APPLICATION NO. | : 10/934923 | |
| DATED | : April 22, 2008 | |
| INVENTOR(S) | : Wenmei Li et al. | |

It is certified that error appears in the above-identified patent and that said Letters Patent is hereby corrected as shown below:

Title page, item (73) Assignee: should read Spansion LLC

Signed and Sealed this

Twenty-second Day of July, 2008

JON W. DUDAS
*Director of the United States Patent and Trademark Office*